(12) United States Patent
Tsai

(10) Patent No.: US 6,376,351 B1
(45) Date of Patent: Apr. 23, 2002

(54) HIGH FMAX RF MOSFET WITH EMBEDDED STACK GATE

(75) Inventor: Chao Chieh Tsai, Hsih-Chu (TW)

(73) Assignee: Taiwan Semiconductor Manufacturing Company, Hsin-chu (TW)

(*) Notice: Subject to any disclaimer, the term of this patent is extended or adjusted under 35 U.S.C. 154(b) by 0 days.

(21) Appl. No.: 09/893,081

(22) Filed: Jun. 28, 2001

(51) Int. Cl.[7] ................. H01L 21/3205; H01L 21/4763
(52) U.S. Cl. .................... 438/592; 438/592; 438/275; 438/638
(58) Field of Search ................. 438/275, 592, 438/638, 970

(56) References Cited

U.S. PATENT DOCUMENTS

| | | | |
|---|---|---|---|
| 5,268,330 A | 12/1993 | Givens et al. | 437/195 |
| 5,650,342 A | 7/1997 | Satoh et al. | 437/36 |
| 5,731,239 A | 3/1998 | Wong et al. | 438/296 |
| 5,970,375 A | 10/1999 | Gardner et al. | 438/637 |
| 5,976,972 A * | 11/1999 | Inohara et al. | 438/624 |
| 6,010,954 A | 1/2000 | Ho et al. | 438/596 |
| 6,063,675 A | 5/2000 | Rodder | 438/291 |
| 6,069,047 A | 5/2000 | Wanlass | 438/305 |
| 6,121,129 A * | 9/2000 | Greco et al. | 438/622 |
| 6,180,501 B1 * | 1/2001 | Pey et al. | 438/299 |
| 6,284,613 B1 * | 9/2001 | Subrahmanyam et al. | 438/299 |
| 6,326,291 B1 * | 12/2001 | Yu | 438/592 |
| 2001/0001075 A1 * | 5/2001 | Ngo et al. | 438/257 |

* cited by examiner

*Primary Examiner*—John F. Niebling
*Assistant Examiner*—Angel Roman
(74) *Attorney, Agent, or Firm*—George O. Saile; Stephen B. Ackerman; William J. Stoffel

(57) ABSTRACT

A method for forming a wide gate stack over a gate in a rf device is described. The invention reduces the gate resistance and the Rs significantly. A substrate has a digital area and a rf area. Devices used in digital circuits will be formed in the digital area and devices used in RF circuits will be formed in the rf area. In both rf and digital areas, gate structure are provided comprising: a gate dielectric and a gate electrode, Source and drain (S/D) regions, source and drain silicide regions, gate silicide regions over the gate electrode. We form a stop layer over the substrate. Next, we form a first interlevel dielectric layer over the stop layer. We polish the first interlevel dielectric layer and the stop layer to expose the gate silicide region. Next, we form a polish stop layer and a second interlevel dielectric layer over the surface. In the digital area, we form a contact holes and in the rf area we to expose the source and drain silicide regions. In the rf area, a wide gate trench top opening is formed through the second interlevel dielectric layer and the polish stop layer to expose gate silicide region. In the digital area, we form contact plugs and in the RF area we form a wide gate top and contact plugs.

26 Claims, 7 Drawing Sheets

HIGH FMAX RF MOSFET WITH EMBEDDED STACK GATE

BACKGROUND OF INVENTION

1) Field of the Invention

This invention relates generally to fabrication of semiconductor devices and more particularly to the fabrication of a gate with a wide top and more particularly to the fabrication of a gate with a wide top in a chip with both digital and RF circuits.

2) Description of the Prior Art

As semiconductor technologies continue to require improvements in the performance of integrated circuit devices, processes must be developed to meet those requirements which easily integrate into existing fabrication processes. In particular, increases in speed require low sheet resistance gates to minimize time constants, as well as narrower gate widths, thinner gate dielectrics and shallower source and drain regions. More particularly, the inventors have found that FET's used in RF circuits require even low gate sheet resistance because this can increase Fmax and reduce noise.

As the gate length get smaller, Fmax degrades due to larger parasitics. FMax is the frequency where the maximum power gain of the transistor degrades to unity. Parasitics are the gate resistance, gate to source capacitance, gate to drain capacitance and other junction capacitances. The paracitics are increasing because the gate are getting narrower thus increasing Rg; and the LDD I/I doses are increasing thereby increasing the capacitance.

There are processes that form wide top gates. However there is a need to improve these processes.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 6,063,675 (Rodder) shows a gate with a wide T top.

U.S. Pat. No. 5,731,239 (Wong et al.) teaches a silicide process for a gate top.

U.S. Pat. No. 5,650,342 (Satoh et al.) shows a T-shaped gate with a wide top.

U.S. Pat. No. 6,010,954 (Ho et al.) shows a T-shaped gate with a wide top.

U.S. Pat. No. 6,069,047 (Wanlass) and U.S. Pat. No. 5,970,375 (Gardner et al.) show gate contact processes.

U.S. Pat. No. 5,268,330 (Givins et al.) shows a process to improve the gate sheet resistance.

SUMMARY OF THE INVENTION

It is an object of the present invention to provide a method for fabricating a gate stack with a wide top.

It is an object of the present invention to provide a method for fabricating a gate stack with a wide top that has a W/TiN/CoSix interface that reduces gate resistance.

It is an object of the present invention to provide a method for fabricating a gate stack with a wide top that is self aligned between the metal and poly gate.

It is an object of the present invention to provide a method for fabricating a chip with both digital/base band and RF circuits where in the RF circuit area, the gate stack has a wide top.

To accomplish the above objectives, the present invention provides a method a chip with both digital and RF circuits where in the a RF circuit, the gate stack has a wide top.

A substrate has a digital area and a rf area. Devices used in digital circuits will be formed in the digital area and devices used in RF circuits will be formed in the RF area.

The following steps are performed in both the digital area and the rf area, unless otherwise stated. We form a gate dielectric and a gate electrode over a substrate. Next, we form LDD regions adjacent to the gate electrode. Then, we form spacers on the sidewall of the gate dielectric and the gate electrode. Source and drain (S/D) regions are formed aside the gate electrode. Next, we form source and drain silicide regions over the S/D regions and gate silicide regions over the gate electrode.

We form a stop layer over the substrate, the source and drain silicide regions, the gate silicide regions, and the spacers. Then, we form a first interlevel dielectric (ILD) layer over the stop layer. We polish the first interlevel dielectric layer using the stop layer and the gate silicide region as a polish stop. In the same polish step, we polish the stop layer using the gate silicide region as a polish stop to expose the gate silicide region. Subsequently, we form a polish stop layer on the first interlevel dielectric (ILD) layer. A second interlevel dielectric layer is formed over the polish stop layer.

In the digital area, we form a contact holes through the first and the second interlevel dielectric layers to expose the gate silicide region and the source and drain silicide regions. In the same process step, in the rf area, we form a contact trench through the second interlevel dielectric layer, the polish stop layer, and the first interlevel dielectric layer, and the stop layer to expose the source and drain silicide regions.

In the rf area, a wide gate trench top opening is formed through the second interlevel dielectric layer and the polish stop layer exposing gate silicide region.

In the digital area, conductive material is deposited to fill the contact holes to form contact plugs and to the silicide gate region and the silicide source/drain regions. In the same step, in the RF area we deposit conductive material filling the wide gate trench top opening to form a wide gate top and filling the contact trench to form a contact plug contacting the source and drain (S/D) silicide regions.

We form a first metal layer over the second interlevel dielectric layer. The first metal layer contacting the contact plugs and the wide gate top.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings. The present invention provides a method of forming a system on a chip (SOC) that has both Digital/base band circuits and RF circuits on one chip. In the Digital/base band areas, logic and memory devices are formed. In the RF circuit area, RF circuit related devices are formed. The preferred embodiment of the method of the invention for fabricating a gate with a wide top gate stack in a RF area while forming gate in a digital/base band area is describe below. A important feature of the invention is the wide top gate 82 in the RF area 52 (See FIG. 7). Also, the first metal 94 connects W/PO stack gate 82 20B directly without using contact hole to eliminate the FET degradation due to high contact resistance. See FIG. 7.

Figure 7:
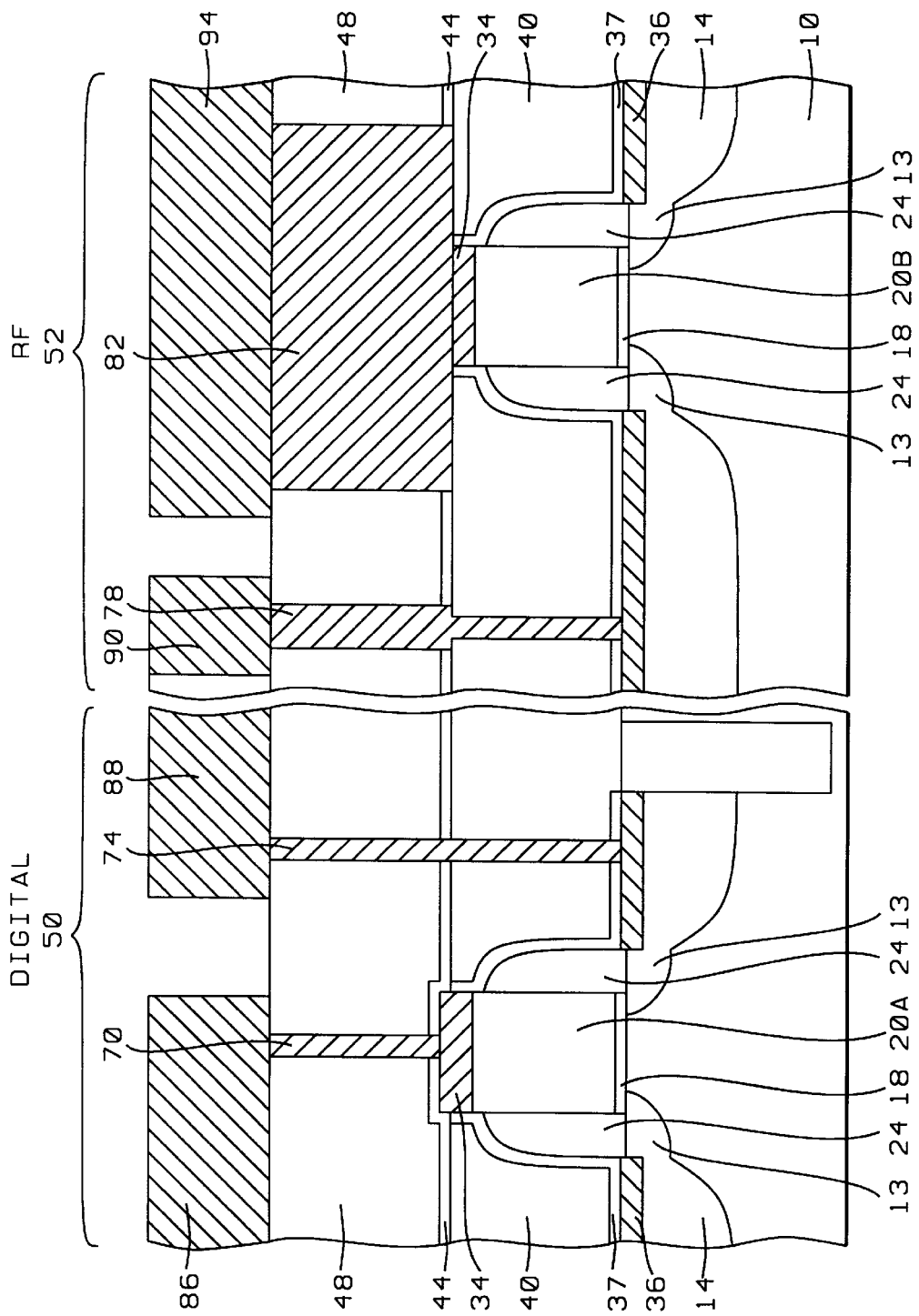

FIG. 7 shows the final structure of the invention. FIG. 7 shows the wide gate top 82 over a gate electrode 20B in the RF device area 52. In the Base band/Digital area 50, a gate electrode 20A is formed without the wide top.

Figure 1:
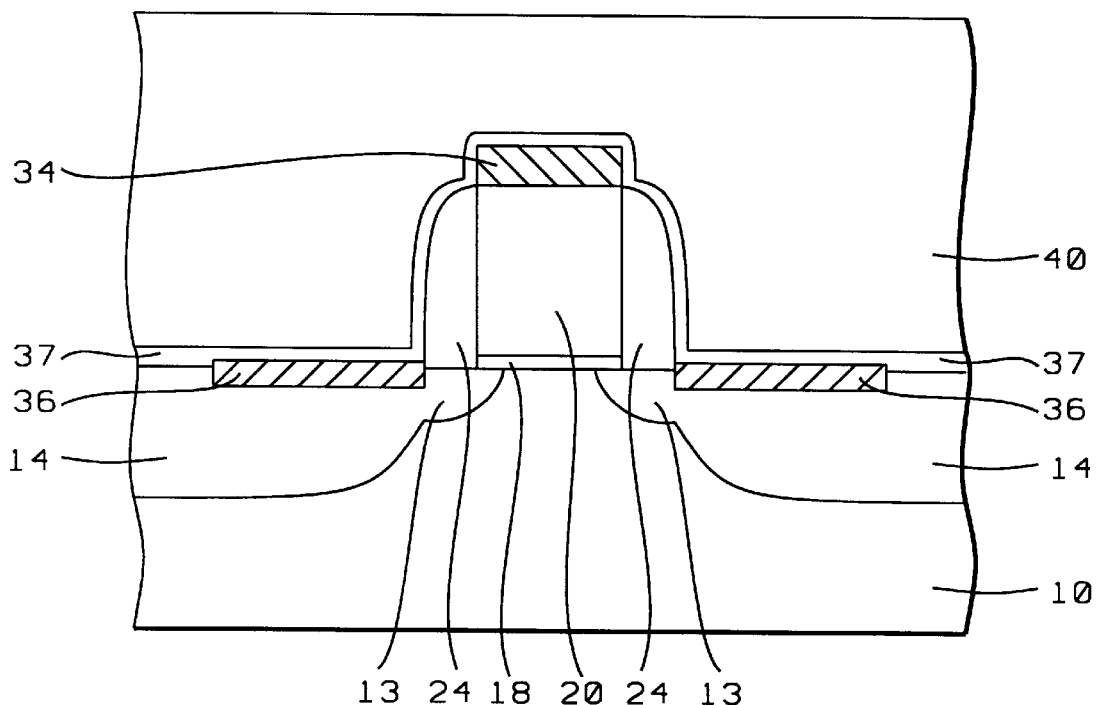
FIGS. 1 through 3 are cross sectional views for illustrating a method according to the present invention that is performed in both the digital/base band area and the RF area.

A. FIG. 1—Gate Structures

Referring to FIG. 1, a substrate is provided substrate 10. As shown in FIGS. 4 to 7, the substrate has a digital area 50 and a rf area 52 (See FIG. 4); wherein devices used in digital circuits will be formed in the digital/base band area and devices used in RF circuits will be formed in the RF area.

The device s in the RF circuits preferably operate at a frequency between 0 (e.g., DC) and 120 GHz and more preferably between 100 Hz and 120 GHz.

Figure 2:
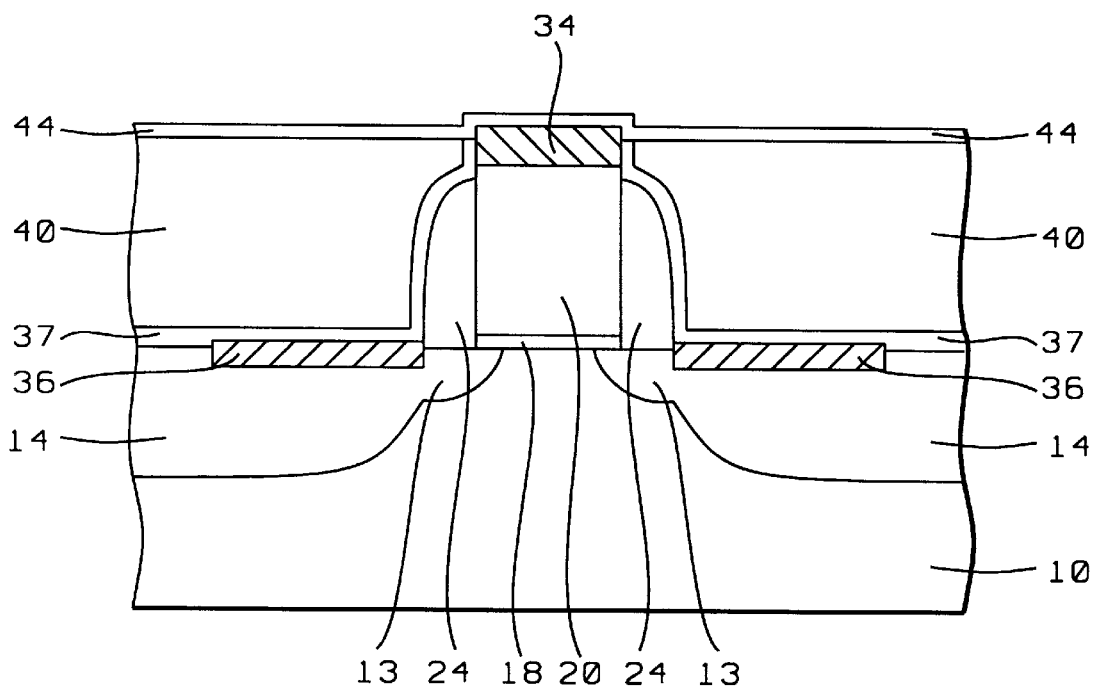
Figure 3:
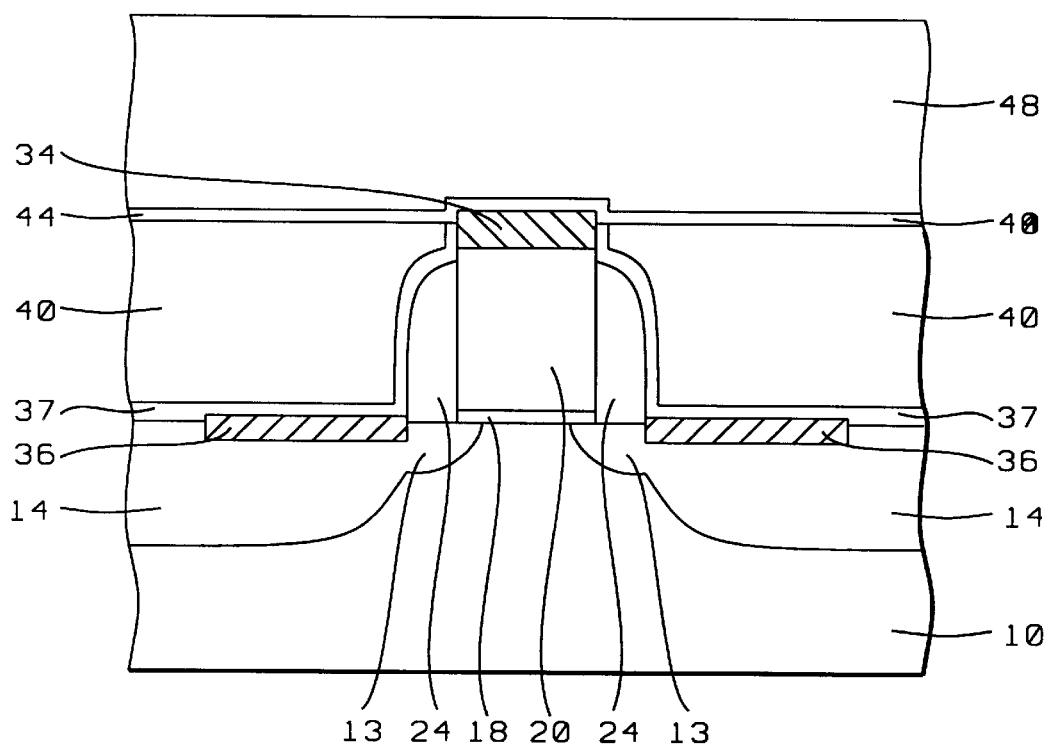

Unless stated, the process steps shown in FIGS. 1 to 3 are performed in both the substrate has a digital/Base band area 50 and a rf area 52. That is gate structures are formed in both the areas 50 52. The gate structure and steps shown in FIGS. 1 to 3 are formed in both the digital area and rf areas.

As shown in FIG. 1, in the digital area 50 and the rf area 52, we form a gate dielectric 18 and a gate electrode 20 over a substrate 10. In FIGS. 4 to 7, the gate 20 formed in the Digital area 50 is labeled 20a and the gate in the RF area 52 is labeled 20B. The gate electrode 20 preferably has a width between 0.05 and 1 μm.

Still referring to FIG. 1, in the digital area 50 and the rf area 52, we form LDD regions 13 adjacent to the gate electrode 20.

Next, in the digital area 50 and the rf area 52, we form spacers 24 on the sidewall of the gate dielectric and the gate electrode 20.

In the digital area 50 and the rf area 52, we form source and drain (S/D) regions 14 aside the gate electrode 20.

In the digital area 50 and the rf area 52, we form source and drain silicide regions 36 over the S/D regions 14 and gate silicide regions 34 over the gate electrode 20. The source and drain silicide regions 36 and the gate silicide regions 34 are preferably comprised of Cobalt Silicide. The CoSix gate silicide regions are important to reduce gate sheet resistance.

In the digital area 50 and the rf area 52, we form a stop layer 37 over the substrate, the source and drain silicide regions 36, the gate silicide regions 34, and the spacers 24. The stop layer 44 is preferably comprised of silicon nitride having a thickness of between about 300 and 500 Å and more preferably between 390 and 410 Å.

In the digital area 50 and the rf area 52, we form a first interlevel dielectric (ILD) layer 40 over the stop layer 37. The first interlevel dielectric (ILD) layer 40 preferably has a thickness of between about 2500 and 4000 Å.

B. CMP and Stop Layer 44

As shown in FIG. 2 in the digital area 50 and the rf area 52, we polish (e.g., chemical-mechanical polish (CMP)) the first interlevel dielectric layer 40 using the stop layer 37 and the gate silicide region 34 as a polish stop. In the same polish step, we polish the stop layer using the gate silicide region 24 as a polish stop to expose the gate silicide region 34. This step is critical to remove the ILD1 40 from around the gate structure 34 20 18.

In the digital area 50 and the rf area 52, we form a polish stop layer 44 on the first interlevel dielectric (ILD) layer 40. The polish stop layer 44 is preferably comprised of Silicon oxynitride (SiON) has a thickness between 250 and 350 Å(tgt 300 Å).

C. ILD2

As shown in FIG. 3, in the digital area 50 and the rf area 52, we form a second interlevel dielectric layer 48 over the stop layer 44. The second interlevel dielectric layer 48 is preferably comprised of silicon oxide or a low k material and preferably has a thickness between 2000 and 7000 Å and more preferably about 5500 Å.

D. Contact Trench 62 and Contact Hole 58 60

Figure 4:
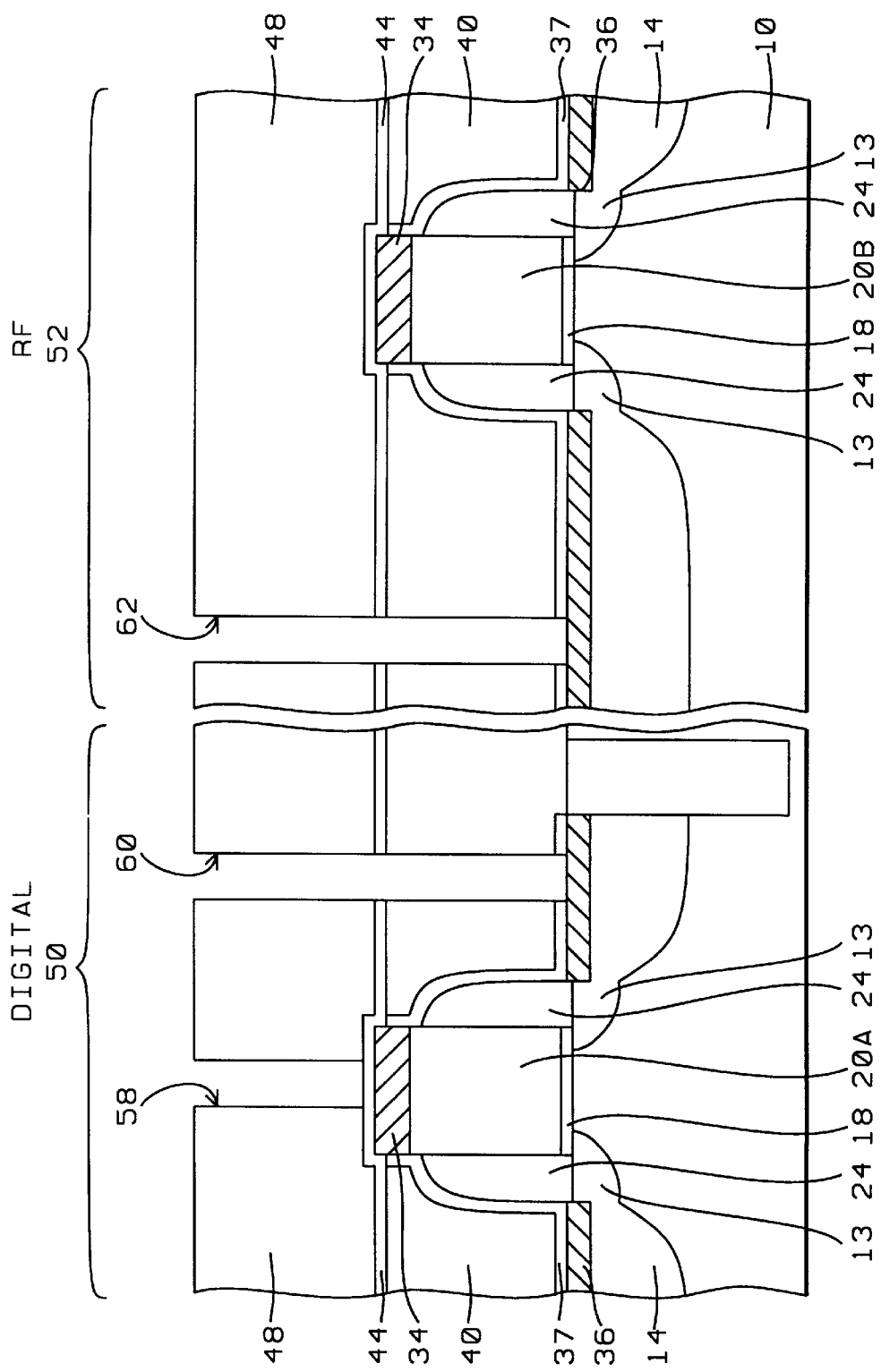
FIGS. 4 through 7 are cross sectional views for illustrating a method according to the present invention according to the present invention.

As shown in FIG. 4, in the digital area 50, we form contact holes 58 60 through the first and the second interlevel dielectric layers to expose the gate silicide region and the source and drain silicide regions 36. In the same process step, in the rf area 52, we form a contact trench 62 through the second interlevel dielectric layer, the polish stop layer 44, and the first interlevel dielectric layer 48, and the stop layer 37 to expose the source and drain silicide regions 36. Preferably all three type openings 58 60 and 62 etched at the same time using the same photo-mask/resist and etch steps.

E. Stack Gate Trench Etch—Trench 68

Figure 5:
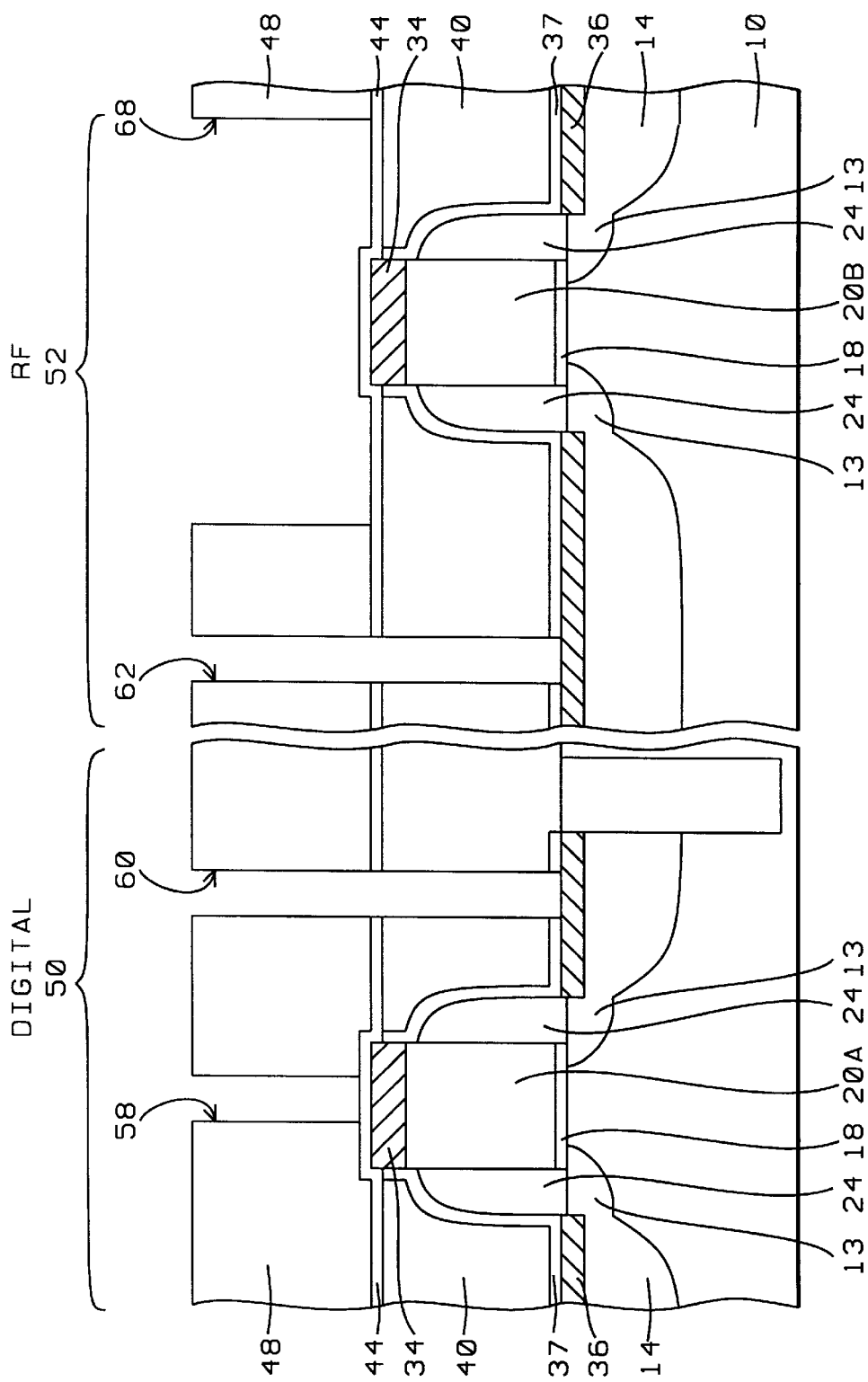

As shown in FIG. 5, in the rf area 52, we form a wide gate top trench opening 68 through the second interlevel dielectric layer and the polish stop layer 44 to expose gate silicide region 34. The wide gate trench top opening is formed in a separate step than the previously formed contact trench and contact holes. The wide gate trench top opening preferably has a width between 0.04 and 2.4 μm and more preferably 0.04 and 2.0 μm. The wide gate trench top opening is preferably at least 10 percent wider than the gate electrode 20. The wide gate trench top opening 68 is preferably formed by forming a photoresist pattern over the surface with an opening where the wide gate trench top opening 68 will be formed and then etching.

F. Metal Layer Dep and CMP

Figure 6:
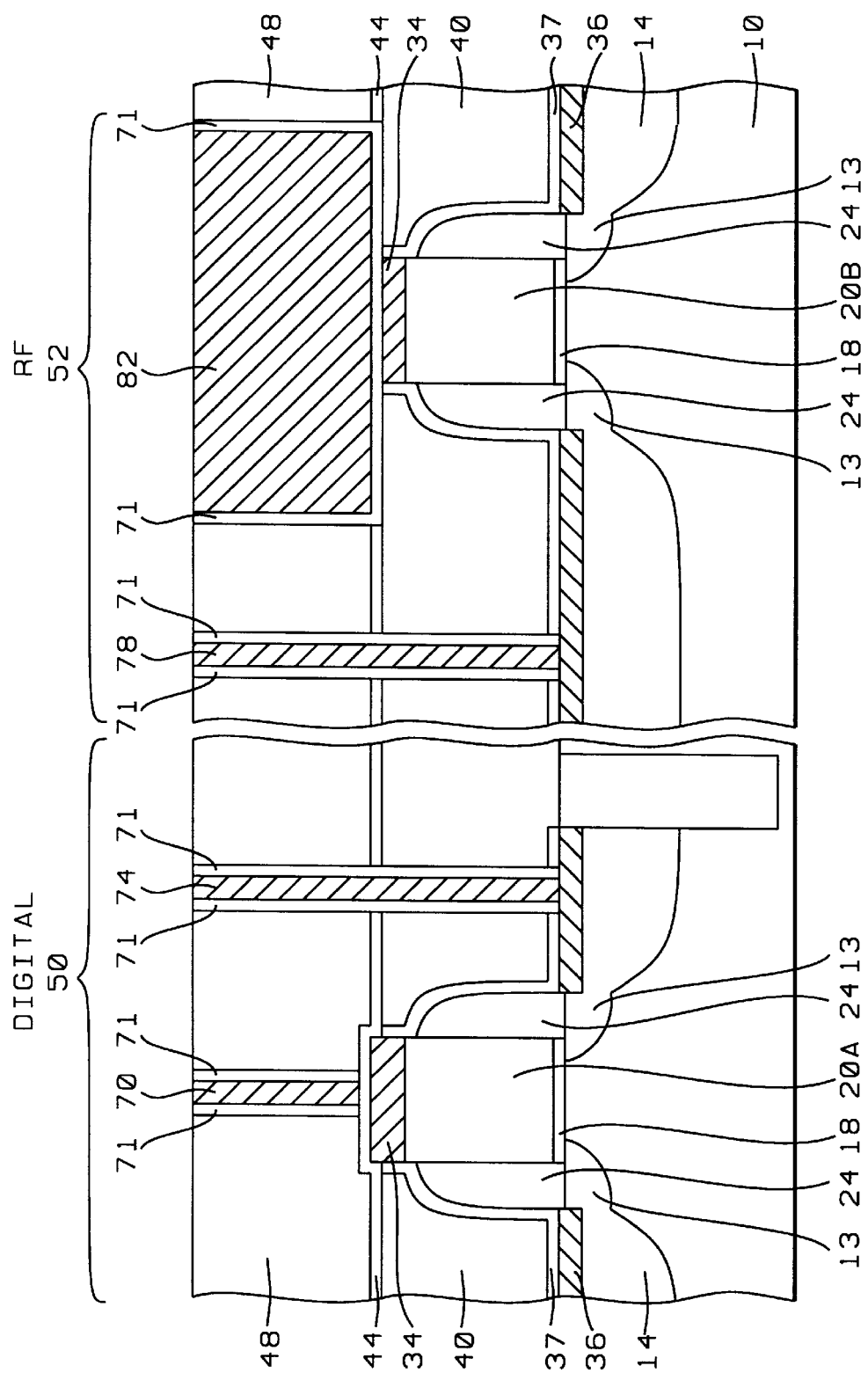

As shown in FIG. 6, in the digital area 50, we deposit a conductive material to fill the contact holes to form contact plugs 70 74 to the silicide gate region and the silicide source/drain regions. In the same step, in the RF area 52 we deposit conductive material to fill the wide gate trench top opening 68 to form a wide gate top 82 and fill the contact trench 62 to form a contact plug 78 contacting the source and drain (S/D) silicide regions 36.

The conductive material filling (e.g., 71 82) is a barrier layer 71 of TiN and an overlying Tungsten plug 82 and the process of depositing conductive material filling comprises the barrier layer and depositing a tungsten layer and then chemical-mechanical polish (CMP) the barrier layer and the tungsten layer. The choice of metals is important to the invention. The tungsten wide gate top 82, TiN barrier metal 71 and the CoSix gate silicide 34 form superior ohmic contact between the wide gate top 82 and the gate electrode/ CoSix 34 similar to a contact interface.

The wide gate top 82 is wider than the gate electrode 20. The gate electrode 20 preferably has a width between 0.02 and 2 μm and more preferably between 0.02 and 1.8 μm. The wide gate top 82 preferably has a width between 0.02 and 2.4 μm and between about 0.04 and 2.0 μm. The wide gate top 82 is important in the RF device area 52 because the large gate top 82 lowers the Resistance of the gate. The wide gate top 82 is not required in the Base band/digital area because the resistance of the gate is sufficient for baseband and digital applications/devices.

The wide gate top allows narrow gate electrode widths but reduces the gate sheet resistance.

G. Metal-2 Lines

As shown in FIG. 7, we form a first metal layer 86 88 90 94 over the second interlevel dielectric layer 48. The first metal layer contacts the contact plugs 70 74 78 and the wide gate top 82. The first metal layer 86 88 90 94 is comprised of Al, Al alloys, Cu, W, or TiN.

After this, a second interlevel dielectric layer is formed and a second metal layer is formed. Then additional conductive and dielectric layers are formed to complete system on a chip (SOC).

H. Top Down FIG. 8

Figure 8:
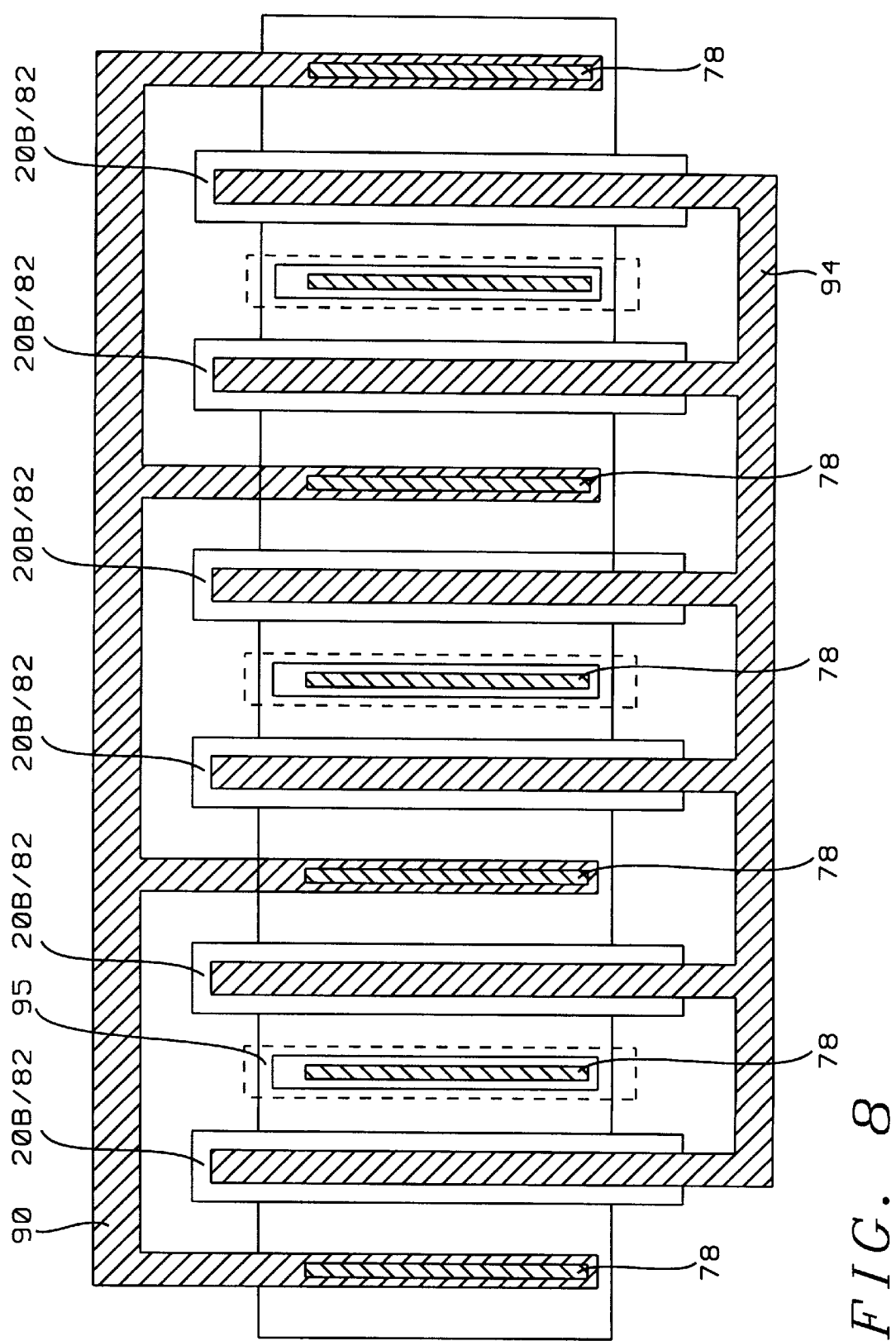
FIG. 8 shows a top down view of the invention in the RF device area 52.

Top down FIG. 8 shows the device of the invention in the RF area 52. FIG. 8 shows a metal 2 layer 95 that contacts the source contacts 74.

I Major Features of the Invention

Main features of the invention are:
1) Use contact formation process to form W/PO stack gate to avoid the up - scaling of gate resistance of RF MOSFET in deep sub then the micro regime.
2) metal 1 connects W/PO stack gate directly without using contact hole to eliminate the FET degradation due to high contact resistance.
3) metal 1 connect the whole FET gate including inner OD region to remove Fmax degradation factor (RG+RS).
4) Replace contact hole with contact trench in OD region to reduce Rc.

J. Advantages of the Invention

Some Advantages of the invention over the prior art are:
1) Reduce gate sheet resistance (Rg) significantly
2) Reduce Rs significantly (RS is source resistance which includes contact resistance.)
3) T-Shape W/PO stack gate provide self-align between W and polysilicon gate.
4) Employing standard contact process or damascene process to form W/PO stack gate with a simplified and robust process.
5) increase fmax.
6) reduce channel noise resulting from Rg.

In the above description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention. Also, the flow rates in the specification can be scaled up or down keeping the same molar % or ratios to accommodate difference sized reactors as is known to those skilled in the art.

Unless explicitly stated otherwise, each numerical value and range should be interpreted as being approximate as if the word about or approximately preceded the value of the value or range.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabrication a gate with a wide top comprising the steps of:
   a)
      providing a substrate; providing a gate dielectric layer, a gate electrode and spacers over a substrate; providing source and drain regions adjacent said gate electrodes;
      providing source and drain silicide regions over said source and drain regions and a gate silicide region over said gate electrode;
   b) forming a stop layer over said substrate, said source and drain silicide regions, said gate silicide region and said spacers;
   c) forming a first interlevel dielectric layer over said stop layer;
   d) polishing said first interlevel dielectric layer using said stop layer and said gate silicide region as a polish stop and polishing said stop layer to expose said gate silicide region;
   e) forming a polish stop layer over said first interlevel dielectric layer and said gate silicide region;
   f) forming a second interlevel dielectric layer over said polish stop layer;
   g) forming a contact trench through at least said second interlevel dielectric layer, said polish stop layer, and said first interlevel dielectric layer, and said stop layer to expose said source and drain silicide regions;
   h) forming a wide gate trench top opening through said second interlevel dielectric layer and said polish stop layer to expose said gate silicide region;
   i) depositing a conductive material to fill said wide gate trench top opening to form a wide gate top and to fill said contact trench to form a contact plug contacting said source and drain silicide regions; and
   j) forming a first metal layer over said second interlevel dielectric layer; said first metal layer contacting said contact plugs and said wide gate top.

2. The method of claim 1 wherein said wide gate top is wider than said gate electrode.

3. The method of claim 1 wherein said wide gate top has a width between 0.04 and 2.4 μm and said gate electrode has a width between about 0.02 and 2 μm.

4. The method of claim 1 wherein said conductive material has a thickness between 2000 and 7000 Å.

5. The method of claim 1 wherein said source and drain silicide regions and said gate silicide regions are comprised of cobalt silicide.

6. The method of claim 1 wherein said stop layer is comprised of silicon nitride having a thickness of between about 300 and 500 Å.

7. The method of claim 1 wherein said stop layer is comprised of silicon nitride having a thickness of between 390 and 410 Å.

8. The method of claim 1 wherein said first interlevel dielectric layer has a thickness of between about 2000 and 6000 Å.

9. The method of claim 1 wherein said polish stop layer is comprised of silicon oxynitride has a thickness between 250 and 350 Å.

10. The method of claim 1 wherein said second interlevel dielectric layer has a thickness between 2000 and 7000 Å.

11. The method of claim 1 wherein said conductive material is a barrier layer of TiN and an overlying tungsten plug and the process of depositing said conductive material comprises depositing said barrier layer and depositing a tungsten layer and chemical-mechanical polish said barrier layer and said tungsten layer.

12. The method of claim 1 wherein said first metal layer is comprised of a material selected from the group consisting of Al, Al alloy, Cu, W and TiN.

13. A method of fabrication a gate with a wide top in a rf area; comprising the steps of:

a)
  providing a substrate; said substrate has a digital area and a rf area; wherein devices used in digital circuits will be formed in said digital area and devices used in rf circuits will be formed in said rf area;
  providing gate dielectric layers, gate electrodes and spacers over a substrate in said digital area and said rf area;
  providing source and drain regions adjacent said gate electrodes in said digital area and said rf area;
  providing source and drain silicide regions over said source and drain regions and gate silicide regions over said gate electrode in said digital area and said rf area;

b) in said digital area and said rf area, forming a stop layer over said substrate, said source and drain silicide regions, said gate silicide regions and said spacers;

c) in said digital area and said rf area, forming a first interlevel dielectric layer over said stop layer;

d) in said digital area and said rf area, removing portions of said first interlevel dielectric layer and removing portions of said stop layer to expose said gate silicide region;

e) in said digital area and said rf area, forming a polish stop layer over said first interlevel dielectric layer and said gate silicide region;

f) in said digital area and said rf area, forming a second interlevel dielectric layer over said polish stop layer;

g) in said digital area, forming a contact holes at least through said first and said second interlevel dielectric layers to expose said gate silicide region and said source and drain silicide regions and
  in the same process step, in said rf area, forming a contact trench through said second interlevel dielectric layer, said polish stop layer, and said first interlevel dielectric layer, and said stop layer to expose said source and drain silicide regions; said contact holes and said contact trench are formed simultaneously;

h) in said rf area, forming a wide gate trench top opening through said second interlevel dielectric layer and said polish stop layer exposing said gate silicide region;

i) in said digital area, depositing a conductive material to fill said contact holes to form contact plugs and to said silicide gate region and said silicide source/drain regions and in said RF area and depositing said conductive material to fill said wide gate trench top opening to form a wide gate top and filling said contact trench to form a contact plug; said contact plug contacts said source and drain silicide regions; and j) forming a first metal layer over said second interlevel dielectric layer; said first metal layer contacting said contact plugs and said wide gate top.

14. The method of claim 13 wherein said wide gate top is wider than said gate electrode.

15. The method of claim 13 wherein said wide gate top is at least 10 percent wider than said gate electrode.

16. The method of claim 13 wherein said wide gate top has a width between 0.04 and 2.4 $\mu$m and said gate electrode has a width between about 0.02 and 2 $\mu$m.

17. The method of claim 13 wherein said conductive material has a thickness between 2000 and 7000 Å.

18. The method of claim 13 wherein said source and drain silicide regions and said gate silicide regions are comprised of cobalt silicide.

19. The method of claim 13 wherein said stop layer is comprised of silicon nitride having a thickness of between about 300 and 500 Å.

20. The method of claim 13 wherein said stop layer is comprised of silicon nitride has a thickness of between 390 and 410 Å.

21. The method of claim 13 wherein said first interlevel dielectric layer has a thickness of between about 2000 and 6000 Å.

22. The method of claim 13 wherein said polish stop layer is comprised of silicon oxynitride has a thickness between 250 and 350 Å.

23. The method of claim 13 wherein said second interlevel dielectric layer has a thickness between 2000 and 7000 Å.

24. The method of claim 13 wherein said conductive material is a barrier layer of TiN and an overlying tungsten plug and the process of depositing said conductive material comprises depositing said barrier layer and depositing a tungsten layer and chemical-mechanical polish said barrier layer and said tungsten layer.

25. The method of claim 13 wherein said first metal layer is comprised of a material selected from the group consisting of Al, Al alloy, Cu, W and TiN.

26. The method of claim 13 wherein said devices in the rf area operate at a frequency between 100 Hz and 120 GHz.

* * * * *